March 30, 1965 P. F. GRECO ETAL 3,176,261
PRINTED CIRCUIT BOARD CONNECTOR
Filed Dec. 28, 1961 3 Sheets-Sheet 1
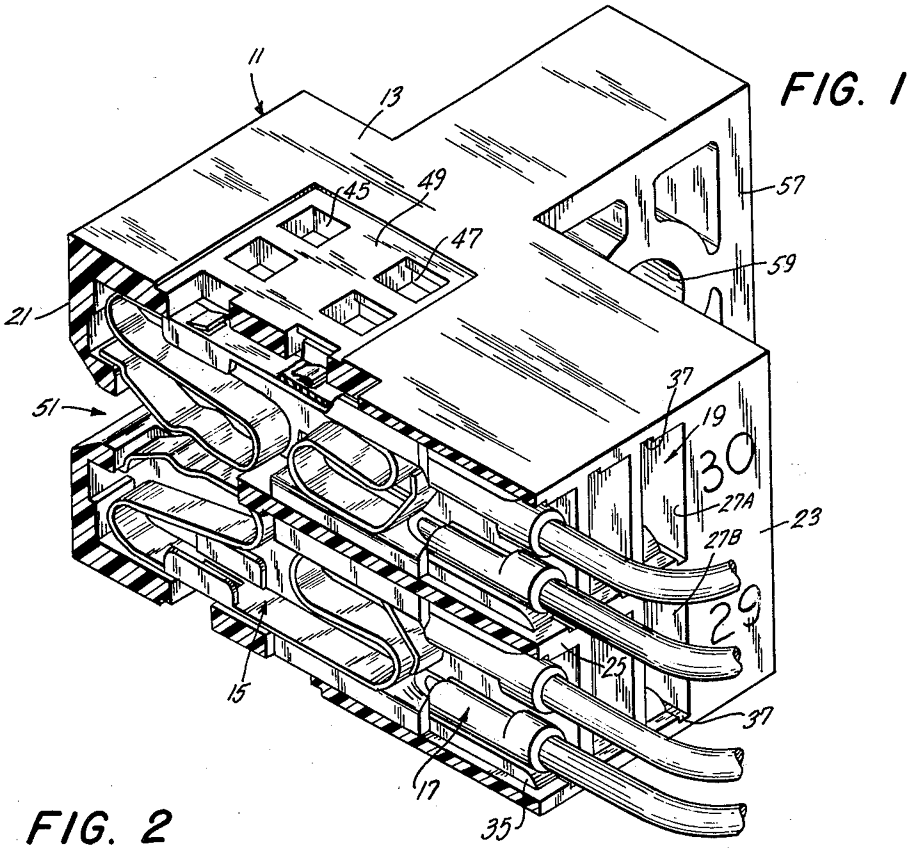
FIG. 1 FIG. 2
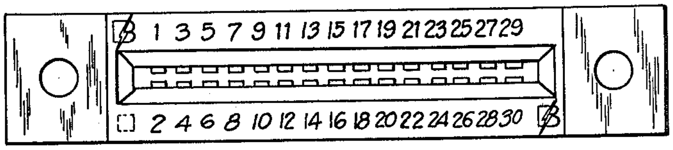
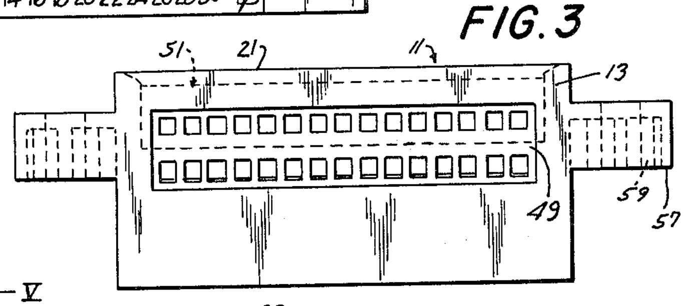
FIG. 3
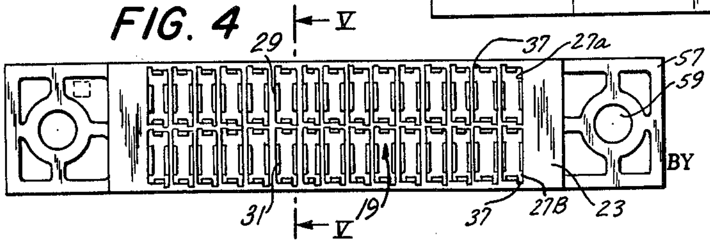
FIG. 4
INVENTORS
PETER F. GRECO &
HEINZ PIORUNNECK
BY
Attorney March 30, 1965 P. F. GRECO ETAL 3,176,261

PRINTED CIRCUIT BOARD CONNECTOR

Filed Dec. 28, 1961 3 Sheets-Sheet 2

INVENTORS
PETER F. GRECO &
HEINZ PIORUNNECK

BY

Attorney

March 30, 1965 P. F. GRECO ETAL 3,176,261

PRINTED CIRCUIT BOARD CONNECTOR

Filed Dec. 28, 1961 3 Sheets-Sheet 3

INVENTORS
PETER F. GRECO &
HEINZ PIORUNNECK
BY
Sailer L. Kuch
Attorney

1

3,176,261
PRINTED CIRCUIT BOARD CONNECTOR

Peter F. Greco, Norwalk, and Heinz Piorunneck, South Norwalk, Conn., assignors to Burndy Corporation, a corporation of New York Filed Dec. 28, 1961, Ser. No. 162,874
5 Claims. (Cl. 339—176)

This invention relates to electrical connectors and, more particularly, to electrical connectors for cards or boards having electrical components and circuitry thereon.

Printed circuit board connectors are well known in the prior art. The boards have a plurality of spaced apart parallel contact surfaces on one or both sides of the board. These contact surfaces are customarily engaged by a plurality of mating, spaced apart, parallel resilient contacts. These contacts are usually permanently mounted in the connector insulating body, and wires are usually permanently connected thereto. The replacement of an individual contact is difficult, if not impossible.

As a result of the current trend to miniaturization, it is necessary to provide a maximum of connector contacts in a minimum of both total volume and, especially, linear measure along the length of the leading edge of the board. It is desirable that independent connector contacts be provided for the contact surfaces of each side of the board, and that each connector contact be able to receive a plurality of wires. The connector contacts must be as small as possible and the spacing between adjacent contacts must be a minimum. Each contact must be accurately located so that it will mechanically and electrically engage but one board contact surface and no others.

It is, therefore, an object of this invention to provide a miniature connector wherein an individually insertable and removable connector contact is provided for each board contact surface on each side of the board.

Another object is to provide a connector contact to which a plurality of wire terminals may be removably connected.

Yet another object is to provide a mating wire terminal of improved design.

Still another object is to provide a mating terminal assembly for a coaxial cable.

A further object is to provide an improved removable commoning strip or bus for a plurality of stacked-together connectors.

Yet a further object is to provide an improved connecting and shielding arrangement for a plurality of printed circuit boards.

These and other objects and features of this invention will become more apparent by reference to the following description taken in conjunction with the accompanying drawings, in which:

FIGURE 1 is a perspective view in cross section showing an assembled connector embodying this invention;

FIGURE 2 is a front view of the connector housing or insulated body of FIGURE 1;

FIGURE 3 is a top view of the connector housing of FIGURE 1;

FIGURE 4 is a rear view of the connector housing of FIGURE 1;

2

Figure 5:
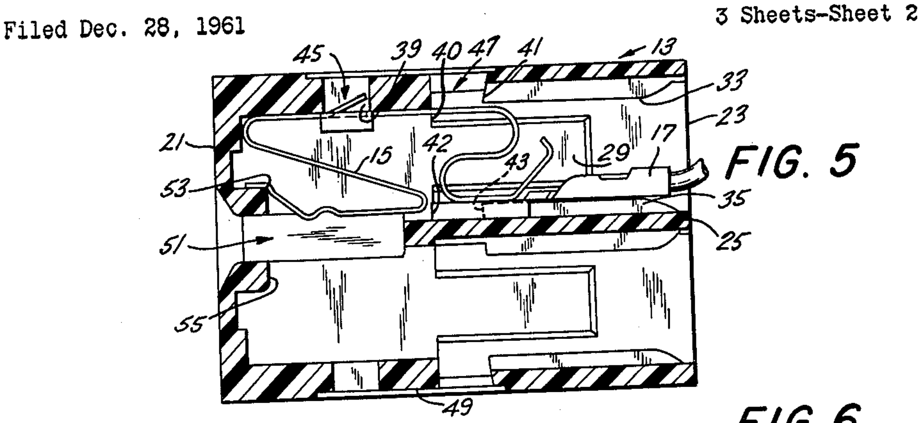
FIGURE 5 is a side view in cross section of the connector housing taken along plane V—V in FIGURE 4.
Figure 6:
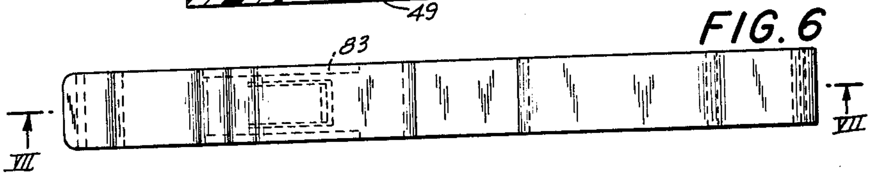
FIGURE 6 is a top view of the connector contact of FIGURE 1.
Figures 7, 8:
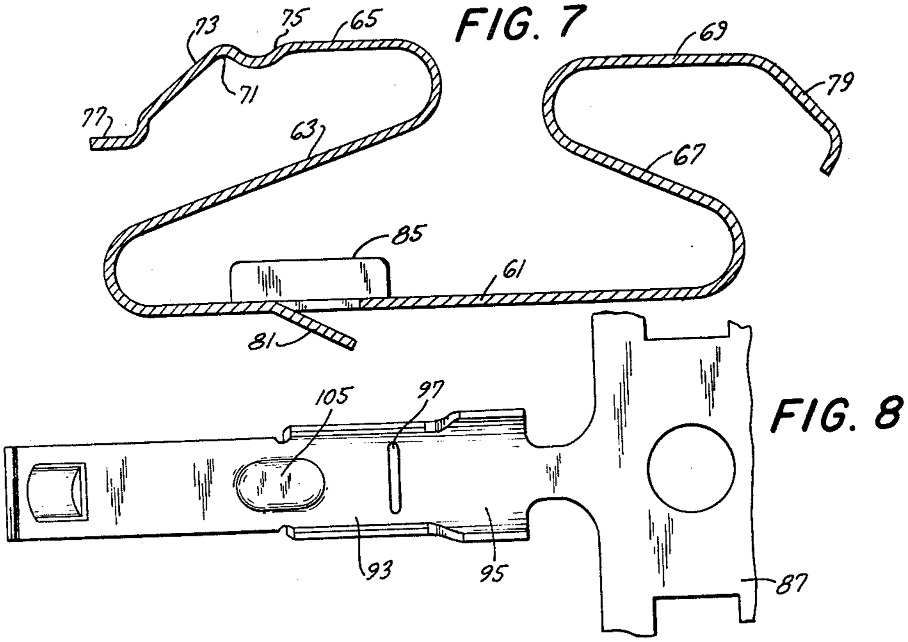
FIGURE 7 is a side view in cross section of the connector contact taken along plane VII—VII in FIG. 6.
FIGURE 8 is a top view of the wire terminal of FIGURE 1.
Figure 9:
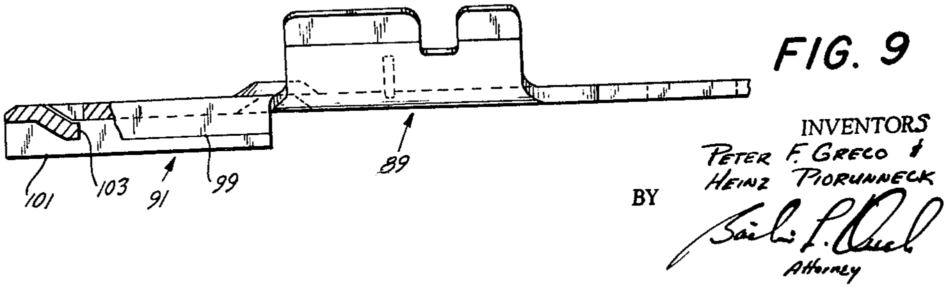
Figures 10, 11, 12:
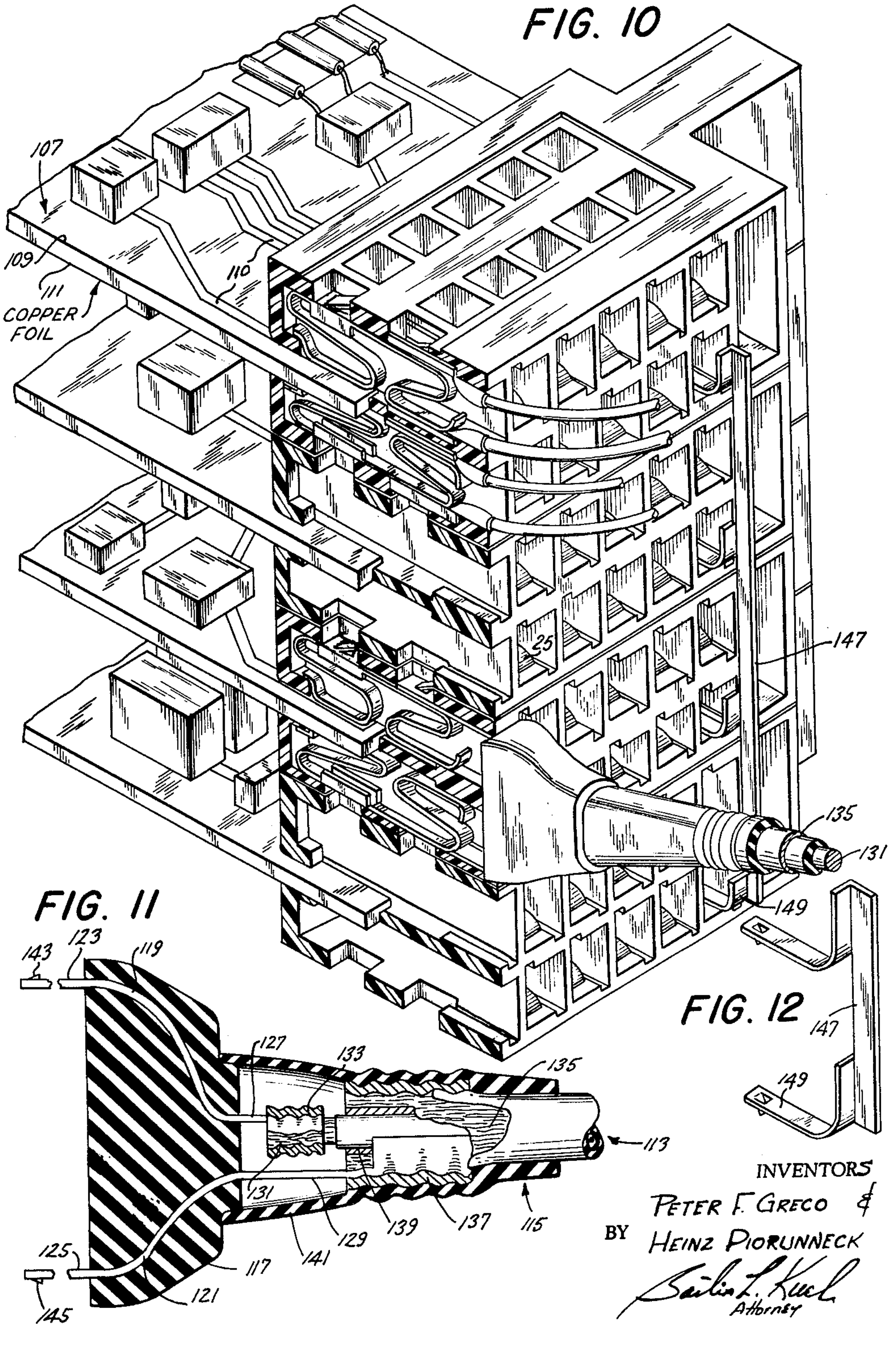

FIGURE 9 is a side view of the wire terminal of FIGURE 1;

FIGURE 10 is a perspective view in cross section showing a plurality of stacked connectors embodying this invention;

FIGURE 11 is a side view in cross section of a terminal assembly for use with a coaxial cable; and FIGURE 12 is a perspective view of a commoning strip or bus for use with the stacked assembly of FIGURE 11.

Referring to the drawings, it will be seen that the connector 11 comprises a substantially rectangular solid shaped body 13 made of suitable insulating material, such as a polycarbonate resin; a plurality of spring contacts 15, which may be stamped and bent up from flat strip stock of a suitably conductive, yet resilient material, such as quarter-hard beryllium copper strip; and a plurality of conductor or wire terminals 17 which may be stamped and bent up from flat strip stock of a suitably conductive and rigid material, such as cartridge brass.

The connector body 13 has a plurality of closely-spaced bores 19 therethrough, from its front, circuit board-receiving face 21, to its rear, wire terminal-receiving face 23. Each bore includes a central web 25 dividing the bore into an upper spring contact-receiving socket 27A and a diametrically symmetrical lower socket 27B. A right and a left sidewall projection 29 and 31, as shown in FIG. 4, are provided in each socket to accurately align the inserted spring contact. An outer and an inner projection 33 and 35, respectively, are provided in each socket to serve as guides for the inserted wire terminals. A groove 37 is provided adjacent one side of each of the outer and inner projections for polarizing cooperation with the wire terminals, as will be discussed later. The staggering of the grooves 37 permits the maintenance of a uniform wall thickness between the sockets. A plurality of shoulders 39, 40, 41, 42 and 43 are provided in each socket to cooperate with resilient tabs or detents on the spring contacts and wire terminals, as will be discussed later. These retention shoulders are molded in by core pins and require the use of rectangular openings 45 and 47 through the walls of the bores. An overall stepped recess 49 is provided which includes these openings to increase the electrical creepage path between the adjacent contacts of two connectors when mounted against each other, as shown in FIGURE 10, or when mounted against a ground plate. If desired, an insulating tape can be cemented into the recess 49, thereby completely sealing the wall of the connector. A central transverse slot 51 is provided in the front face 21 of the connector in line with the central web 25, which intersects each of the bores 19 and accommodates the inserted printed circuit board. An upper and lower web 53 and 55, respectively, are provided adjacent the board slot 51 to cooperate with the inserted spring contacts and to provide a "closed entry feature." A discussion of a closed entry feature may be found in the Dupre patent, U.S. 2,981,924. A flange 57 with a central bore 59 is provided on each side of the connector body to receive the usual mounting bolts.

The spring contact 15 is formed into a double Z shape having a base portion 51, a front middle portion 63, a front outer portion 65, a rear middle portion 67 and a rear outer portion 69. The front outer portion 65 includes a reverse bend 71 to form two electrical contact-making surfaces or lines 73 and 75, respectively, and terminates in a hook subportion 77. The rear outer portion 69 terminates in a bent tail subportion 79. The base portion 61 is pierced to form a rigid tab 81, and includes two bent up side pieces 83 and 85, respectively, adjacent the tab to reinforce the base portion thereabout.

The wire terminal 17 may be formed into a continuous strip of sheet metal 87 for installation and cut-off from the carry strip by automatic tooling. Each terminal includes a wire-receiving portion 89 and a mating contact-receiving portion 91. The wire-receiving portion 89 is bent up into a channel or U-shaped bare conductor-receiving subportion 93 and a channel or U-shaped insulated conductor receiving subportion 95, and includes a conductor-snubbing transverse dimple 97. The mating contact-receiving portion 91 is bent down into a channel shape, including a short side plate 99 and a long side plate 101. The base of the channel is pierced downwardly to form a rigid tab 103. A longitudinal rib 105 is raised to overlap the junction between the wire and mating contact receiving portions to reinforce and prevent bending in this transition portion.

A spring contact 15 may be inserted from the connector rear face 23 into each socket 27 with the contact front outer portion 65 disposed towards the transverse printed circuit board-receiving slot 51. When fully inserted, the contact front hook subportion 77 is disposed under the adjacent web 53 or 55, and the locking tab 81 is engaged with adjacent shoulder 39. The spring contact is thus inserted by compressing both contact front and rear Z portions and "snap-locked" in place. As may be seen in FIGURE 1, the front outer portion 65 extends beyond the web into the board slot 51 and is adapted to engage a contact surface on an inserted printed circuit board. The spring contact 15 may be released from the connector body 13, when the connector 11 is installed and the openings 45 are obscured, by inserting an appropriate tool from the rear of the bore 19 to deflect the contact base portion 61 and the locking tab 81 away from the shoulder 39.

Two wire terminals 17 may be independently engaged with each spring contact. One terminal may be slid between the outer projection 33 and the spring contact base portion 61, and another terminal may be slid between the inner projection 35 and the spring contact rear outer portion 69. The channel shape of the terminal 91 is adapted to fit around the inner or outer projection 35 or 33, respectively, with the longer side plate 101 fitting into the groove 37. The combination of the groove and the side plate serves to polarize the insertion of the terminal into the connector. It may be noted that the wire receiving portion 89 of each terminal is thus disposed towards the center of the socket 27. When the terminal 17 is fully inserted into the connector body 13, its front end abuts the shoulder 40 or 42 while the locking tab 103 engages the adjacent shoulder 41 or 43. The wire terminal is thus inserted by compressing the contact rear Z portion and "snap-locked" in place. The terminal may be released from the body by inserting an appropriate tool from the rear of the bore to deflect the terminal 17 and the locking tab 103 away from the shoulder.

An embodiment of this invention is made which includes 43 pairs of spring contacts on a connector board slot width of 4.4 inches. The spring contacts are approximately 0.5 inch long, and the wire terminals are approximately 0.4 inch long.

An assembly of stacked connectors 11 is shown in FIGURE 10. In this particular example, each of printed circuit boards 107 has its electronic components and circuitry disposed on the upper surface 109 of the board, and connected to independent, spaced apart contacts 110. The lower surface 111 of the board is coated with a conductive material, such as copper foil. By this means the components of each board are electrostatically shielded from the components of the other boards. Obviously, if the shielding feature is sacrificed, contacts might be disposed on the lower surface also. Each pair of spring contacts 15 may be connected to a coaxial cable 113 by means of the coaxial terminal assembly 115 shown in FIGURE 11.

The coaxial terminal assembly 115 includes a plug body 117 which may be made of a resilient insulating material and a pair of terminals 119 and 121 imbedded therein. The outer end 123 or 125, respectively, of each terminal may be formed as a channel similar to the mating contact receiving portion previously described, or as here shown, as a flat strip. The inner end 127 or 129, respectively, of each terminal is formed into a U or semicircular shape. The terminal end 127 and the inner conductor 131 of the coaxial cable are crimped together by means of a pair of coaxial tubes 137 and 139 as shown in the Dupre patent, U.S. 2,536,003. A layer of insulation or a boot 141 joins the end of the coaxial cable 113 to the end of the plug body 117. The plug may be engaged with the appropriate pair of spring contacts 15, terminal 123 being connected to the upper spring contact and thence to the printed circuit board upper contact surface, while terminal 125 is connected to the lower spring contact and thence to the printed circuit board shield plane. The plug may be removed from the connector by squeezing the plug and releasing the terminal locking tabs 143 and 145 from the connector body shoulders if the terminals are of channel form, or by inserting a suitable probe past the overhang of the plug into the bores to deflect the terminals from the shoulders.

A ground commoning strip or bus bar 147, as shown in FIGURE 12, may be used to electrically common desired upper or lower spring contacts in a given column. The bar may be formed in convenient lengths with projections 149 formed similarly to the mating contact receiving portion of the terminals previously discussed. The bar may be cut to the desired length and have any desired projections cut off to omit desired spring contacts.

The invention has thus been described but it is desired to be understood that it is not confined to the particular forms or usages shown and described, the same being merely illustrative, and that the invention may be carried out in other ways without departing from the spirit of the invention and, therefore, the right is broadly claimed to employ all equivalent instrumentalities coming within the scope of the appendant claims, and by means of which objects of this invention are attained and new results accomplished, as it is obvious that the particular embodiments herein shown and described are only some of the many that can be employed to obtain these objects and accomplish these results.

We claim:

1. A connector for a printed circuit board having a plurality of spaced-apart independent contacts on both sides of the board adjacent one edge, comprising:

an insulating housing having a front face and a rear face and a plurality of spaced-apart bores therethrough from face to face, a transverse slot into said front face bisecting the forward portions of each of said vertical bores and adapted to receive therein the edge of the printed circuit board and its contacts, a transverse web bisecting the rearward portion of each of said bores, and coplanar with said transverse slot, said transverse slot and said web dividing each said vertical bore into an upper and a lower contact-receiving socket;

a resilient contact disposed in each said housing socket, each said contact having a resilient forward portion extending in part into said transverse slot and adapted to engage a contact on the printed circuit board, and a resilient rearward portion having a contact surface disposed adjacent the wall of said housing socket and biased against the wall of said housing socket and adapted to make electrical contact with a terminal disposed between said wall and said contact surface;

and cooperating interlocking means on each said contact and said housing socket to snap-lock said contact in said socket.

2. A connector according to claim 1 wherein each said contact includes an elongated base portion interconnecting said forward and rearward portions, said forward and rearward portions each being formed by an extension of said base portion via a pair of return bends into a Z shape.

3. A connector according to claim 2 wherein said contact is adapted to be inserted into said housing socket from said rear housing face;

each said housing socket being constricted adjacent said front housing face to abut said forward portion of said contact and prevent the overinsertion of said contact into said housing socket;

a projection struck up from said contact base portion to engage a first shoulder formed into said housing socket to prevent the accidental removal of said contact from said housing socket;

said housing socket constriction and said first shoulder and said contact projection and said forward portion providing said first interlocking means.

4. The connector according to claim 3 wherein said contact base portion is channel-shaped adjacent said struck-up projection.

5. A connector according to claim 1 further including an auxiliary connector for a cable having first and second insulated conductors;

said auxiliary connector including a housing and first and second terminals secured therein, each having a portion extending forwardly of said housing;

said first terminal forward portion engaged with the rearward portion of the contact disposed in the upper one of said spaced apart bores;

said second terminal forward portion engaged with the rearward portion of the contact disposed in the lower socket of said bore.

References Cited in the file of this patent

UNITED STATES PATENTS

| | | |
|---|---|---|
| 2,640,970 | Falge et al. | June 2, 1953 |
| 2,882,512 | Morone | Apr. 14, 1959 |
| 2,911,612 | Jackson et al. | Nov. 3, 1959 |
| 2,938,190 | Krehbiel | May 24, 1960 |
| 2,961,629 | Kamm | Nov. 22, 1960 |
| 3,001,171 | Schultz | Sept. 19, 1961 |
| 3,015,083 | Juris | Dec. 26, 1961 |

OTHER REFERENCES

Shergalis, L. D.: Electronic Design, April 29, 1959, page 47.